United States Patent [19]  
Koenig et al.

[11] 3,945,856  
[45] Mar. 23, 1976

[54] METHOD OF ION IMPLANTATION THROUGH AN ELECTRICALLY INSULATIVE MATERIAL

[75] Inventors: Wilfried G. Koenig, Sindelfingen, Germany; James S. Makris, Wappingers Falls; Burton J. Masters, Poughkeepsie, both of N.Y.

[73] Assignee: IBM Corporation, Armonk, N.Y.

[22] Filed: July 15, 1974

[21] Appl. No.: 488,376

[52] U.S. Cl. ............... 148/1.5; 29/571; 148/187; 357/91
[51] Int. Cl.² ............................... H01L 21/265
[58] Field of Search ............ 148/1.5, 187; 29/571; 357/91

[56] References Cited
UNITED STATES PATENTS

| 3,388,009 | 6/1968 | King | 148/1.5 |
| 3,529,347 | 9/1970 | Ingless et al. | 29/571 |
| 3,566,519 | 3/1971 | Lapham, Jr. | 148/187 X |
| 3,632,438 | 1/1972 | Carlson et al. | 148/187 UX |
| 3,704,178 | 11/1972 | Hill | 148/1.5 |
| 3,717,790 | 2/1973 | Dalton et al. | 148/1.5 |
| 3,793,088 | 2/1974 | Eckton, Jr. | 148/1.5 |

Primary Examiner—L. Dewayne Rutledge
Assistant Examiner—J. M. Davis
Attorney, Agent, or Firm—J. B. Kraft

[57] ABSTRACT

A method of ion implantation into a semiconductor substrate which comprises forming a layer of an electrically insulative material, such as silicon dioxide, on the substrate over the region to be ion implanted. Then, a beam of ions having sufficient energy to pass through the layer of insulative material and to penetrate into the substrate is directed at a particular portion of the insulative layer. Before proceeding further, at least the upper half of the insulative layer, and preferably all of the upper portion of the insulative layer, in excess of a remaining thickness of 100A, is removed by etching. Then, the substrate is heated whereby the ions are driven further into the substrate to form the selected ion implanted region.

9 Claims, 7 Drawing Figures

METHOD OF ION IMPLANTATION THROUGH AN ELECTRICALLY INSULATIVE MATERIAL

BACKGROUND OF THE INVENTION

The present invention relates to ion implantation, and more particularly to ion implantation into a semiconductor substrate through a layer of electrically insulative material.

In ion implantation, it is, at the present time, a fairly prevalent practice to ion implant through a relatively thin passivating layer, such as silicon dioxide, having a thickness in the order of 100A to 1,000A instead of ion implanting directly into an exposed semiconductor substrate, such as silicon. This ion implantation through a relatively thin layer is utilized in combination with conventional ion implantation masking techniques. For example, the relatively thin layer may be masked with a material, such as photoresist, which masks the whole surface except for holes through the photoresist exposing the thin layer of insulative material in the regions which are to be ion implanted. Also, the relatively thin layers may be utilized in combination with relatively thick layers of the same material having sufficient thicknesses in the order of from 1,000A to 10,000A so that the ions being implanted do not have sufficient energy to pass through the thicker layers. In such a structure, the thicker portions of insulative material are placed over regions of the substrate which are to be free of the ion implantation.

The art has been moving in the direction of ion implantation through relatively thin layers of insulative material for several reasons. First, all of the semiconductor substrate remains covered during the introduction of the dopant, i.e., none of the substrate is exposed at any point to contaminants in the ambient. Secondly, at many processing stages in forming semiconductor devices, utilization of ion implantation through the passivating or insulative layer avoids the necessity of further masking and etching steps to remove particular portions of the passivating layer, e.g., ion implantation through the gate passivating layer in FET fabrication in order to tailor the conductivity of the channel under the gate. A third advantage is that where a high surface concentration or $C_0$ of impurity in the semiconductor substrate is desired, ion implantation through an insulative layer functions as an aid in achieving a doping profile in the substrate which has a peak at the substrate surface.

In addition to these advantages recognized by the prior art, we have found that the layer of passivating material serves as a trap or catcher for ions of contaminating material within the ion beam. These contaminating ions in a large part result from collisions between the dopant ions of the beam and the ion implantation equipment, e.g., sidewalls or apertures of the defining equipment. We have further found that during the thermal drive-in step conventionally conducted at temperatures in the order of 1,000°C to 1,200°C, the contaminating ions which have been caught or trapped in the passivating layer tend to diffuse from the passivating layer into the substrate and, thereby, contaminate the ion implanted region in the substrate.

The standard contaminants which are caught or trapped in the passivating layer are ions of the material used in the ion implantation equipment. Among these contaminants are atoms or molecules from materials such as iron, nickel, chromium, manganese, or aluminum, as well as oil from vacuum pumps. In some cases, the contaminants result from materials used for masking purposes, e.g., some photoresist masks tend to produce carbon contaminants.

SUMMARY OF THE INVENTION

Accordingly, it is a primary object of the present invention to provide a method of ion implantation which produces ion implanted regions substantially free of contaminating materials from the ion implantation equipment and processing expedients.

It is another object of the present invention to provide a method of ion implantation through a layer of electrically insulative material which produces ion implanted regions in a semiconductor substrate substantially free of contaminants from the equipment and processing expedients used in the ion implantation process.

It is a further object of the present invention to provide a method of ion implantation through a layer of electrically insulative material wherein contaminating materials from ion implantation equipment and processing expedients are prevented from penetrating into the ion implanted region in the substrate during high heat processing steps.

The present invention provides a method of ion implantation into a semiconductor substrate which avoids contamination from ions and light contaminants from the materials utilized in the ion implantation equipment and processing expedients by forming a layer of electrically insulative material on the substrate over the region to be ion implanted. Then, a beam of ions having energy sufficient to pass through the layer and penetrate into the substrate is directed at the layer. The layer acts as a trap or catcher for any contaminating materials in the beam resulting from collisions between particles in the beam and the ion implantation equipment. At this stage, before any high heat drive-in process is carried out with respect to the ion implanted region, at least the upper half of the electrically insulative layer is removed. Then, the high heat drive-in step is carried out at temperatures of from 1,000°C to 1,200°C. As a result of the removal of the upper half of the layer, the penetration into the substrate of the undesirable trapped impurities is minimized if not substantially eliminated.

The removal of the upper portion of the layer may be conveniently carried out by a suitable etchant. For example, if the insulative material is silicon dioxide, conventional hydrofluoric acid etchants may be used.

We have found that when ion implanting through a thin insulative layer, most of the contaminating ions become trapped in the upper portion of the insulative layer. This is particularly the case when making relatively shallow inplants of impurity to an initial implantation depth in the order of 0.15 microns through a relatively thin insulative layer, e.g., silicon dioxide, about 250A in thickness. Thus, if the upper half of the insulative layer is removed by a suitable etchant, the major portion of all potential contaminants are removed and, consequently, are not diffused into the substrate during the subsequent high heat ion implant drive-in step.

The foregoing and other objects, features and advantages of the invention will be apparent from the following more particular description and preferred embodiments of the invention as illustrated in the accompanying drawings.

DESCRIPTION OF THE PREFERRED EMBODIMENTS

Figure 1:
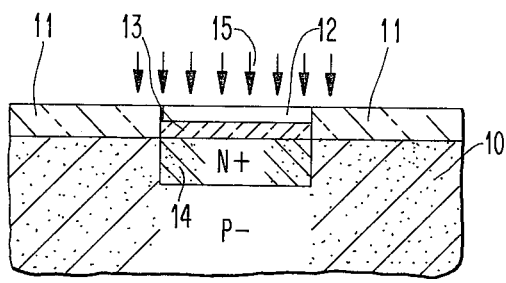
FIGS. 1–7 are diagrammatic, partial sections of a portion of an integrated circuit at various fabrication stages in order to illustrate the practice of the preferred embodiments of the present invention.

With reference to FIGS. 1–7, there will now be described an embodiment of the present invention wherein a buried N+ region, such as an N+ subcollector region, is formed in a P− substrate, after which an epitaxial layer is deposited over the substrate. In FIG. 1, starting with a suitable silicon wafer substrate 10 of P− material, e.g., a silicon substrate having a resistivity of about 10 ohms/cm., the substrate is first masked by forming a relatively thick layer of insulative material having a thickness in the order of 5,000A. This layer 11 in the present embodiment is silicon dioxide formed by conventional thermal oxidation techniques. It may, of course, be formed of other conventional electrically insulative materials, such as silicon nitride or aluminum oxide or silicon oxynitride, formed by conventional deposition techniques, such as chemical vapor deposition or sputter deposition. Likewise, the silicon dioxide may also be deposited by such conventional deposition techniques. After the formation of layer 11, an opening 12 is formed in layer 11 by conventional photolithographic masking and etching techniques utilized in integrated circuit fabrication, after which a relatively thin layer 13, preferably but not necessarily of the same composition as layer 11, is formed within opening 12 by any of the conventional techniques previously described. In the present embodiment, layer 13 is a thin layer of silicon dioxide having a thickness of about 250A formed by thermal oxidation. Still with reference to FIG. 1, N+ region 14 is formed by the introduction of arsenic ions, $^{75}As^+$, as shown, through thin layer 13. The introduction is accomplished using conventional ion implantation equipment and techniques, as described for example in U.S. Pat. No. 3,756,862. The ion beam directed at the substrate has sufficient energy to penetrate layer 13 to a depth in the order of 0.15 microns but insufficient energy to penetrate the thicker layer 11. The dosage level will, of course, vary with the desired sheet resistance of region 14. For example, in order to achieve sheet resistances in the order of from 5 ohms per square to 20 ohms per square, the dosage would vary respectively from $2 \times 10^{16}$ ions/cm$^2$ to $5 \times 10^{15}$ ions/cm$^2$.

Figure 2:
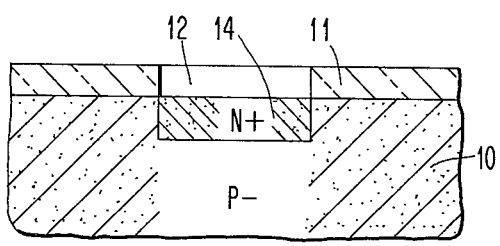

At this stage, the critical aspect of the present invention is carried out. As previously indicated, we have found that thin oxide layer 13 and, in particular, the upper portion thereof, has trapped contaminants, particularly metallic contaminants, from the ion implantation equipment. These contaminants should be substantially removed from the structure before inplanted region is driven in to the desired depth in the substrate by conventional, i.e., drive-in techniques. Of course, these contaminants have also been trapped in the portions of thicker layer 11 which have been subjected to the ion beam 15. However, because of the thickness of layer 11, there is no danger that these contaminants will pass through layer 11 into the substrate during the drive-in step. In order to eliminate the trapped contaminants, layer 13 may be completely removed by conventional etching techniques, as shown in FIG. 2. A conventional etchant for achieving this result where layer 13 is silicon dioxide is a buffered HF solution comprising a 10 percent aqueous solution of HF. A ten second treatment of the structure with this solution will be sufficient to completely remove silicon dioxide layer 13. At the same time, a small portion of the upper surface of thicker silicon dioxide layer 11 is also removed. This in no way affects layer 11. After the removal of layer 13, the structure is rinsed in the ionized water.

While in the embodiment shown, layer 13 is completely removed, we have found it is not necessary to completely remove layer 13 in order to substantially remove all of the impurities. During the ion implantation step, almost all of the contaminating metallic ions from the equipment appear to be trapped in the upper half of layer 13 and especially in the uppermost 100A to 200A of the layer. Accordingly, with most conventional thicknesses of insulative material utilized in standard ion implantation techniques, the removal of the upper half of the layer will remove substantially all of the troublesome contaminants. Accordingly, when utilizing a layer, such as layer 13, having a thickness of about 250A, the present invention may be practiced by removing the upper 150A of the layer, leaving about 100A over the implanted region 14. For many purposes, it is important to have a thin layer of the silicon dioxide present in opening 12 over implanted region 14 during the drive-in. This thin layer will serve as a cap and prevent the loss of the implanted ion from the surface of region 14 to the ambient during the drive-in, i.e., drive-in step.

Figure 3:
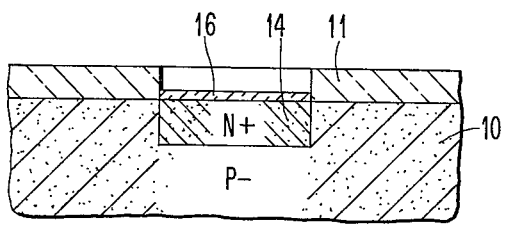

In any event, where layer 13 is completely removed as in the embodiment of FIG. 2, it is preferable that a protective layer 16 of the electrically insulative material, such as silicon dioxide, be regrown or redeposited by the previously described techniques before the high heat drive-in step. Such a structure with a thin layer of silicon dioxide 16 regrown by thermal oxidation is shown in FIG. 3.

Figure 4:
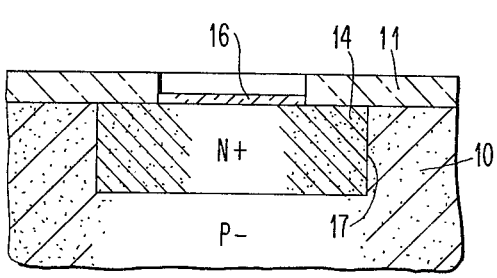
Figure 7:
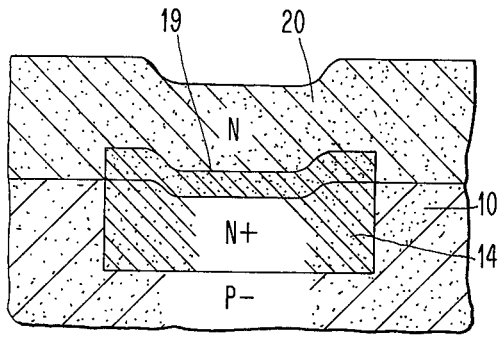

Next, a standard high heat drive-in is carried out at 1,100°C in an inert atmosphere, such as argon, to produce the structure shown in FIG. 4, wherein the PN junction 17 defining the limits of region 14 has penetrated to a depth of about 2 microns.

Figure 5:
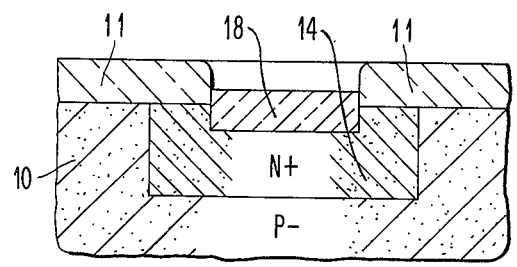

In the embodiment shown, since region 14 is to constitute a subcollector upon which a layer of monocrystalline silicon is to be subsequently epitaxially deposited, it is important that all damage done to the surface of region 14 during the initial ion implantation be removed. Otherwise, any damage points on the surface will serve as focal points for defects, such as stacking faults, in the subsequently deposited epitaxial layer. This damage may be conveniently removed by reoxidizing the surface of region 14 so that a layer of silicon dioxide 18 about 5,000A in thickness is formed, as shown in FIG. 5. This may be accomplished utilizing conventional thermal oxidation techniques well known in the art using temperatures in the order of 1,000°C.

The drive-in and reoxidation steps of FIGS. 4 and 5 may be combined, in which case, the structure is heated in an oxidizing atmosphere at a temperature of about 1,075°C to both drive-in and form layer 18.

Figure 6:
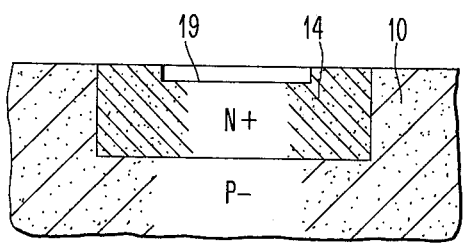

Next, FIG. 6, silicon dioxide layers 11 and 18 are removed from the substrate surface utilizing conventional techniques for removing silicon dioxide from a silicon substrate such as the previously described hydrofluoric acid etchant. The remaining structure contains a step or recess 19 in the surface of N+ subcollector region 14 corresponding to the reoxidized region 18.

Next, N epitaxial layer 20 having a maximum impurity concentration or doping level of $10^{18}$ atoms/cm$^3$ is formed by conventional epitaxial techniques involving a temperature in the order of 950°C to 1,150°C over a period of about 20 minutes. Region 14 will outdiffuse partially up into the epitaxial layer. The epitaxial layer has a thickness in the order of 2 microns. The epitaxial layer may be formed using the apparatus and method described in U.S. Pat. No. 3,424,629. Step or recess 19 remains in the completed structure and is visible through the transparent epitaxial layer. Such a recess is conventional in the art and serves as an indicator for alignment with respect to buried subcollector 14 during subsequent masking steps in the formation of the various regions which may be subsequently formed in epitaxial layer 20.

It should be noted that the principles of the present invention are equally applicable where the ion implantation is made through a thin layer of a semiconductor or conductor material in place of the electrically insulative material. In such a case, the removal of at least the upper half of such a semiconductor or conductor layer will substantially remove contaminating impurities.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of ion implantation into a semiconductor substrate comprising forming a protective layer on said substrate over a region to be ion implanted, directing at said layer a beam of ions having sufficient energy to pass through said layer and penetrate said substrate, maintaining said substrate below 1000°C, removing at least the upper half of said layer through which said ions passed by etching, and, then heating said substrate whereby said penetrated ions are driven further into said substrate to form said ion implanted region.

2. The method of claim 1 wherein said layer is an electrically insulative layer.

3. The method of claim 2 wherein said remaining layer after said etching has a maximum thickness of 100A.

4. The method of claim 3 wherein said layer is completely removed by said etching.

5. The method of claim 3 wherein said substrate is silicon and said layer is silicon dioxide.

6. The method of claim 3 wherein said implanted ions in said region have a concentration of at least $1 \times 10^{18}$ atoms/cm$^3$ after said drive-in.

7. The method of claim 5 wherein said etching is chemical etching hydrofluoric acid.

8. The method of claim 5 wherein said heating for drive-in is conducted in an oxidizing atmosphere whereby the removed portion of said silicon dioxide is regrown during said heating.

9. The method of claim 8 comprising the further steps of removing the silicon dioxide layer after drive-in and epitaxially depositing a silicon layer on the exposed substrate.

* * * * *